United States Patent
Epard et al.

(10) Patent No.: US 11,016,129 B1
(45) Date of Patent: May 25, 2021

(54) VOLTAGE EVENT TRACKING AND CLASSIFICATION

(71) Applicant: Alarm.com Incorporated, Tysons, VA (US)

(72) Inventors: Marc Anthony Epard, Lawrence, KS (US); Murali Pasupuleti, Olathe, KS (US); Robert Leon Lutes, Lawrence, KS (US); David James Hutz, Herndon, VA (US); Ronald Byron Kabler, Roselle, IL (US)

(73) Assignee: Alarm.com Incorporated, Tysons, VA (US)

( * ) Notice: Subject to any disclaimer, the term of this patent is extended or adjusted under 35 U.S.C. 154(b) by 312 days.

(21) Appl. No.: 16/166,633

(22) Filed: Oct. 22, 2018

Related U.S. Application Data

(60) Provisional application No. 62/574,900, filed on Oct. 20, 2017.

(51) Int. Cl.
  *G01R 19/25* (2006.01)
  *G01D 4/00* (2006.01)
  *H04L 12/28* (2006.01)

(52) U.S. Cl.
  CPC ........ *G01R 19/2513* (2013.01); *G01D 4/006* (2013.01); *G01D 4/008* (2013.01); *G01R 19/2509* (2013.01); *H04L 12/2825* (2013.01); *H04L 12/2832* (2013.01); *H04L 2012/2843* (2013.01)

(58) Field of Classification Search
  CPC ............ G01R 19/2513; G01R 19/2509; H04L 12/2832; H04L 12/2825; H04L 2012/2843; G01D 4/008; G01D 4/006; G06Q 50/06
  See application file for complete search history.

(56) References Cited

U.S. PATENT DOCUMENTS

| | | | |
|---|---|---|---|
| 4,999,730 A | 3/1991 | Pickard | |
| 5,819,203 A | 10/1998 | Moore et al. | |
| 9,172,245 B1 * | 10/2015 | Lentine | H02J 3/00 |
| 9,310,405 B2 * | 4/2016 | Lai | G01R 21/133 |
| 9,612,286 B2 * | 4/2017 | Gupta | G01D 4/004 |
| 10,809,159 B2 * | 10/2020 | Neeley | G01D 7/08 |
| 2007/0241739 A1 * | 10/2007 | Uenou | H04L 12/2816 |
| | | | 324/76.17 |

(Continued)

FOREIGN PATENT DOCUMENTS

| | | |
|---|---|---|
| CN | 101399565 | 4/2009 |
| CN | 101713801 | 5/2010 |

(Continued)

*Primary Examiner* — John E Breene
*Assistant Examiner* — Eyob Hagos
(74) *Attorney, Agent, or Firm* — Fish & Richardson P.C.

(57) ABSTRACT

A monitoring system that is configured to monitor a property is disclosed. In one aspect, the monitoring system includes a sensor that is located at the property and that is configured to generate sensor data. The monitoring system further includes a voltage sensor that is configured to generate voltage data by measuring voltage at an electrical outlet located at the property. The monitoring system further includes a monitor control unit that is configured to receive the sensor data; receive the voltage data; determine an action of an electrical device that is located in the property or that is located at a neighboring property in a vicinity of the property; determine whether the electrical device is located at the property or at the neighboring property in the vicinity of the property; and perform a monitoring system action.

20 Claims, 5 Drawing Sheets

(56) References Cited

U.S. PATENT DOCUMENTS

| | | | | |
|---|---|---|---|---|
| 2010/0167659 A1* | 7/2010 | Wagner | G01D 21/00 | 455/67.11 |
| 2010/0305889 A1* | 12/2010 | Tomlinson, Jr. | G06N 7/005 | 702/62 |
| 2012/0004871 A1* | 1/2012 | Tsao | G01R 19/2513 | 702/61 |
| 2012/0068692 A1* | 3/2012 | Patel | G01R 1/20 | 324/202 |
| 2014/0005853 A1* | 1/2014 | Chen | G01R 22/10 | 700/298 |
| 2014/0225603 A1* | 8/2014 | Auguste | G01R 19/2513 | 324/244 |
| 2014/0316595 A1* | 10/2014 | Kayton | H02J 3/14 | 700/291 |
| 2014/0320125 A1* | 10/2014 | Leeb | G01R 21/08 | 324/252 |
| 2014/0333323 A1* | 11/2014 | Kabler | G01D 4/008 | 324/511 |
| 2015/0032583 A1* | 1/2015 | Mello | G06Q 50/06 | 705/30 |
| 2015/0331025 A1* | 11/2015 | Arashima | G01R 21/06 | 702/62 |
| 2016/0116303 A1* | 4/2016 | Rose | G06T 11/206 | 702/188 |
| 2018/0306846 A1* | 10/2018 | Lanzisera | G01R 33/06 | |

FOREIGN PATENT DOCUMENTS

| | | |
|---|---|---|
| CN | 103795773 | 5/2014 |
| CN | 103401254 | 3/2015 |
| JP | 2013518556 | 5/2013 |

* cited by examiner

VOLTAGE EVENT TRACKING AND CLASSIFICATION

CROSS-REFERENCE TO RELATED APPLICATION

This application claims the benefit of U.S. Provisional Application No. 62/574,900, filed Oct. 20, 2017, which is incorporated by reference.

TECHNICAL FIELD

This disclosure generally relates to power systems.

BACKGROUND

Buildings, such as homes and offices, may have electronic systems that monitor voltage fluctuations, which may occur, for example, due to electrical equipment cycling on and off. However, voltage monitoring systems are often incapable of differentiating between voltage fluctuations that occur due to devices used inside a building and voltage fluctuations that occur due to devices used in a neighboring building.

SUMMARY

This disclosure generally describes systems and methods for monitoring voltage in a building and detecting one or more events in the monitored voltage. Voltage measurements for a building are sent from one or more voltage sensors in the building to a processing server, which retrieves additional power measurements for the same building from one or more other devices, such as a smart meter, Hall Effect sensors, current clamps, magnetoresistive sensors or other magnetic field sensors, visual devices such as cameras, magnetic devices, or optical devices. Timestamping and event spacing may be used to synchronize the two measurement data sets. After synchronizing the data, one or more voltage events may be detected and one or more of a source, location, and change associated with the one or more voltage events can be more accurately determined compared to obtaining source, location, and change information from an individual dataset. For example, an off-to-on or on-to-off state change in an appliance, a location of the appliance, and a type of appliance may be determined with enhanced accuracy.

According to an innovative aspect of the subject matter described in this specification, a monitoring system is configured to monitor a property and the monitoring system includes a sensor that is located at the property and that is configured to generate sensor data; a voltage sensor that is configured to generate voltage data by measuring voltage at an electrical outlet located at the property; and a monitor control unit that is configured to receive, from the sensor, the sensor data; receive, from the voltage sensor, the voltage data; based on the voltage data, determine an action of an electrical device that is located in the property or that is located at a neighboring property in a vicinity of the property; based on the sensor data, determine whether the electrical device is located at the property or at the neighboring property in the vicinity of the property; and, based on the action of the electrical device and determining whether the electrical device is located at the property or at the neighboring property in the vicinity of the property, perform a monitoring system action.

This implementation and other implementations may include one or more of the following optional features. The sensor is a magnetic field sensor that is located at a circuit breaker panel of the property and that is configured to generate sensor data that indicates whether power consumption of the property has changed. The magnetic field sensor is a Hall effect sensor. The sensor is configured to sense magnetic fields generated by flowing current, is located at a circuit breaker panel of the property, and is configured to generate sensor data that indicates a power consumption of the property. The sensor is a current clamp. The sensor is a camera that is located at an electrical meter that is configured to supply power the property and that is located at the property. The sensor data is image data of a display of the electrical meter. The sensor is a camera that is located at an electrical meter that is configured to collect power usage data at the property and that is located at the property. The sensor data is video data of a spinning disc of the electrical meter. The sensor is integrated with an electrical meter that is configured to supply power the property and that is located at the property. The sensor data is timestamped power usage data for the property.

The monitor control unit is configured to determine whether the electrical device is located at the property or at the neighboring property in the vicinity of the property by determining that the electrical device is located at the property. The monitor control unit is configured to perform the monitoring system action by logging the action of the electrical device that is located at the property. The monitor control unit is configured to determine whether the electrical device is located at the property or at the neighboring property in the vicinity of the property by determining that the electrical device is located at the property. The monitor control unit is configured to, based on the action of the electrical device that is located at the property, generate a notification indicating the action of the electrical device that is located at the property. The monitor control unit is configured to perform the monitoring system action by transmitting, to a resident of the property, the notification indicating the action of the electrical device that is located at the property.

The monitor control unit is configured to determine whether the electrical device is located at the property or at the neighboring property in the vicinity of the property by determining that the electrical device is located at the neighboring property in the vicinity of the property. The monitor control unit is configured to perform the monitoring system action by bypassing logging of the action of the electrical device that is located at the neighboring property in the vicinity of the property. The monitor control unit is configured to timestamp the sensor data. The monitor control unit is configured to timestamp the voltage data. The monitor control unit is configured to determine whether the electrical device is located at the property or at the neighboring property in the vicinity of the property by comparing timestamps of the sensor data to timestamps of the voltage data. The monitor control unit is configured to compare the timestamps of the sensor data to the timestamps of the voltage data by matching the timestamps of the sensor data with the timestamps of the voltage data. The monitor control unit is configured to, based on matching the timestamps of the sensor data with the timestamps of the voltage, determine energy consumption of the electrical device and other electrical devices located at the property.

According to another innovative aspect of the subject matter described in this specification, a method includes the actions of receiving, from a sensor that is located at a property, sensor data; receiving, from a voltage sensor that configured to measure voltage at an electrical outlet located at the property, voltage data; based on the voltage data, determining an action of an electrical device that is located in the property or that is located at a neighboring property in a vicinity of the property; based on the sensor data, determining whether the electrical device is located at the property or at the neighboring property in the vicinity of the property; and, based on the action of the electrical device and determining whether the electrical device is located at the property or at the neighboring property in the vicinity of the property, performing a monitoring system action.

This implementation and other implementations may include one or more of the following optional features. The sensor is a magnetic field sensor that is located at a circuit breaker panel of the property and that is configured to generate sensor data that indicates whether power consumption of the property has changed. The sensor is configured to sense magnetic fields generated by flowing current, is located at a circuit breaker panel of the property, and is configured to generate sensor data that indicates a power consumption of the property. The sensor is a camera that is located at an electrical meter that is configured to collect power usage data at the property and that is located at the property. The sensor data is image data of the display of the electrical meter. The action of determining whether the electrical device is located at the property or at the neighboring property in the vicinity of the property includes determining that the electrical device is located at the property.

The action of performing the monitoring system action includes logging the action of the electrical device that is located at the property. The actions include determining whether the electrical device is located at the property or at the neighboring property in the vicinity of the property by determining that the electrical device is located at the property; based on the action of the electrical device that is located at the property, generating a notification indicating the action of the electrical device that is located at the property; and performing the monitoring system action by transmitting, to a resident of the property, the notification indicating the action of the electrical device that is located at the property. The action of determining whether the electrical device is located at the property or at the neighboring property in the vicinity of the property includes determining that the electrical device is located at the neighboring property in the vicinity of the property. The action of performing the monitoring system action includes bypassing logging of the action of the electrical device that is located at the neighboring property in the vicinity of the property.

The implementations described in this specification offer a number of advantages. One advantage is that by relying on multiple and independent data sources, the identified events may have lower error rates, such as lower false positive rates. For example, the identified events may be distinguished as occurring inside a building or outside a building. If an event is correctly described as arising from outside the building, the event is not attributed to a device within the building. Thus, a user may determine whether an event is occurring due to a cause, such as an electronic appliance, within a building or a cause outside of the building. Another advantage is that the implementations described herein are low cost, and may be easily installed without the assistance of professionals such as electricians. By relying on voltage measurements obtained from voltage sensors, the event detection systems may continuously monitor electrical changes at low costs and avoid the use of costly power monitoring systems.

Other implementations include corresponding systems, apparatus, computer-readable storage media, and computer programs configured to implement the actions of the above-noted methods.

The details of one or more implementations are set forth in the accompanying drawings and the description below. Other features and advantages will become apparent from the description, the drawings, and the claims.

BRIEF DESCRIPTION OF THE DRAWINGS

Like reference numbers and designation in the various drawings indicate like elements.

DETAILED DESCRIPTION

Figure 1:
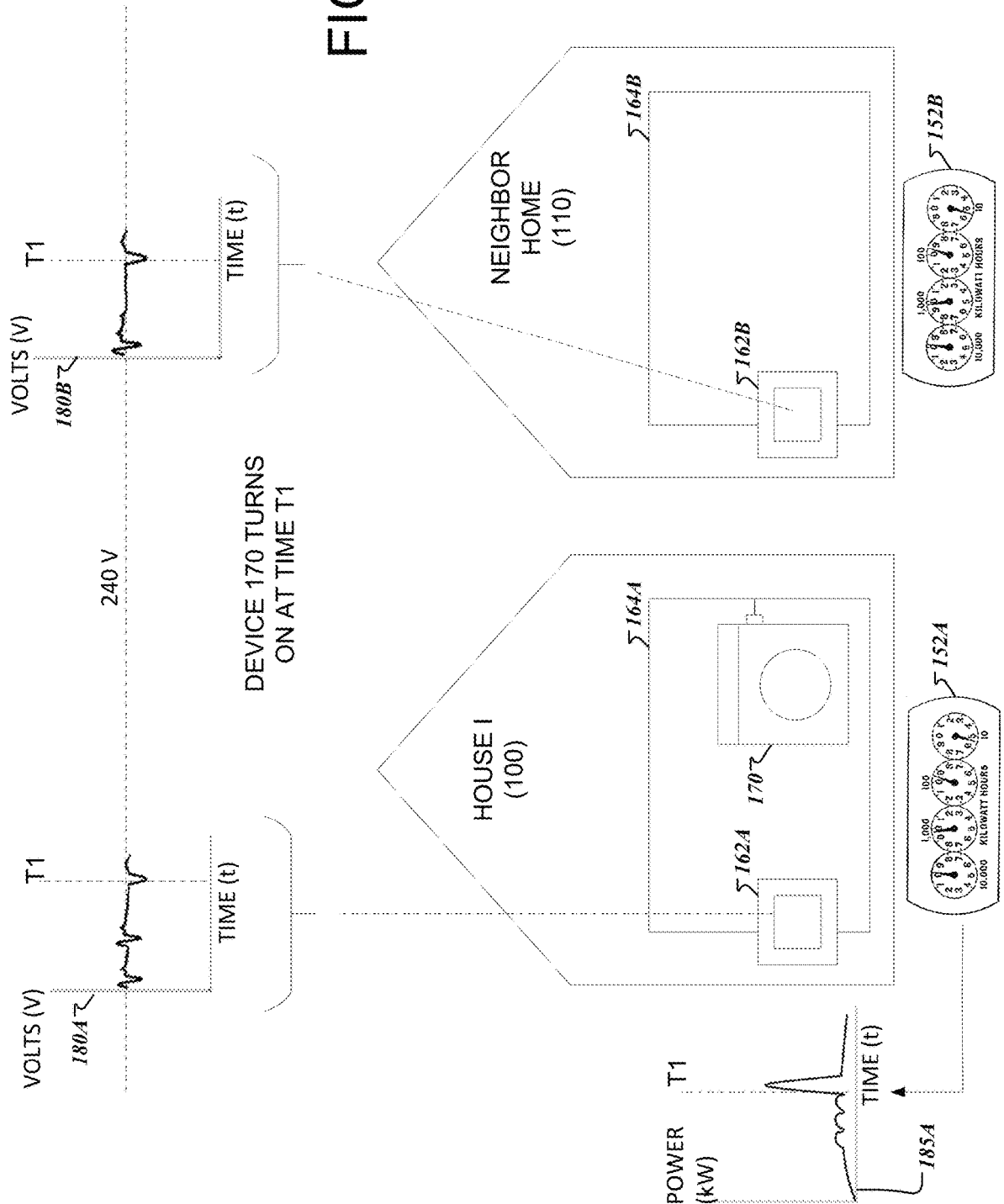
FIG. 1 depicts an example scenario of electricity consumption in two homes.

FIG. 1 depicts an example scenario that includes a house 100 and a neighbor's house 110 located in close proximity to house 100. The house 100 includes a power grid 164A that provides electrical power to one or more devices in the house 100 such as dryer 170. The power grid 164A includes a circuit breaker panel 162A. House 110 also includes a circuit breaker panel 162B and a power grid 164B that provides electrical power to one or more devices in house 110. Power meters 152A and 1526 may be utilized to measure the power consumption in house 100 and house 110, respectively, and voltage sensors may be attached to the power grids 164A and 164B to measure the voltage supply in the homes 100 and 110, respectively. For instance, graph 180A depicts the voltage supply to house 100 according to the measurements obtained by voltage sensors in house 100, graph 1806 depicts the voltage supply to house 110 according to the measurements obtained by voltage sensors in house 110, and graph 185A depicts the power consumption of house 100 according to the measurements obtained by power meter 152A of house 100.

Typically, electronic devices in a building are powered on and off throughout a day. The powering on and off results in corresponding fluctuations in the voltage and power measurements for a house. The powering on or off in a neighbor's home, can result in a fluctuation in the voltage measurements in one's own home. For example, referring to FIG. 1, at time $t_1$, dryer 170 in house 100 is turned on. The powering on of dryer 170 has an associated signature in both the voltage and power measurements for house 100 as shown in graphs 180A and 185A. In particular, as shown in graph 185A, the power consumption in house 100 temporarily surges when additional power is provided to dryer 170. At the same time, as exhibited by graphs 180A and 180B, the voltage measurements for house 100 and 110 show a temporary dip in voltage supply at time $t_1$. As such, the voltage measurements of house 110 depict a similar or identical voltage change around time $t_1$ as the voltage measurements of house 100 even though no dryer was turned on in house 110.

As a user responsible for managing house 110, such fluctuations may be confusing and difficult to understand. Graph 180B on its own may provide little information as to what the source of the voltage fluctuation at time $t_1$ in house 110 may be. For example, one possibility is that a new appliance was powered on in house 110 that required additional power. Another possibility is that there was a systematic glitch in the external power supply to house 110. Another possibility, as is the case in the example illustrated in FIG. 1, is that a device in close proximity to the house 110, such as a dryer in a neighbor's home 100, was powered on and caused a temporary dip in the voltage-time graph associated with house 110. Because there may be multiple reasons for voltage fluctuations to occur, it can often be difficult to determine whether voltage supply changes in a user's home are due to the use of devices within the user's house or due to external interferences.

Figure 2:
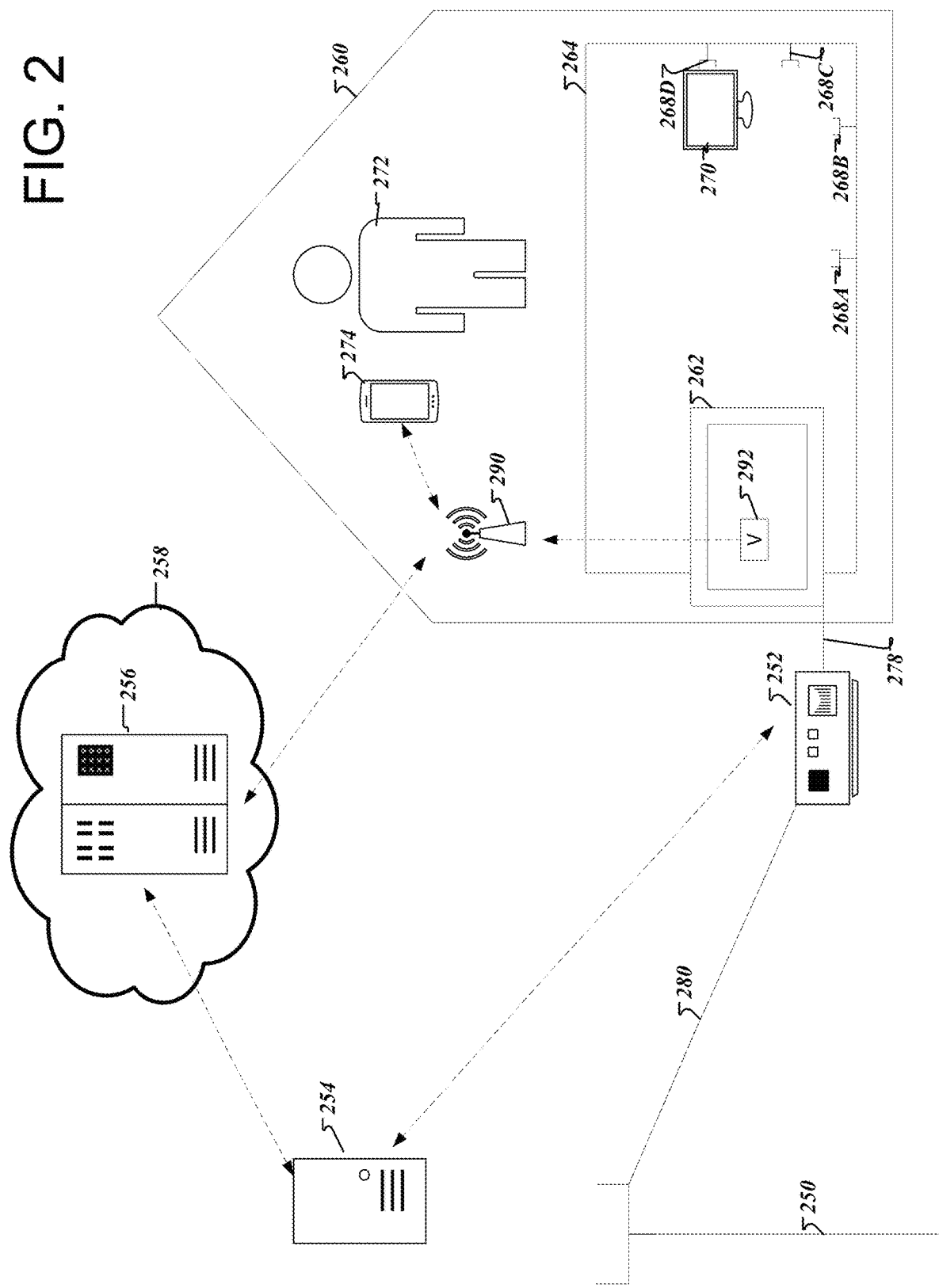
FIG. 2 depicts an example system for voltage tracking.

FIG. 2 depicts an example system for voltage tracking. The system may include an external power network access point 250, a power utility meter 252, a power utility company server 254, a processing server 256, a network 258, and a building 260. The external power network access point 250, such as an electric pole or transformer, may be connected to a power utility meter 252 through one or more power lines 280. The building 260 may have a circuit breaker panel 262 that is connected to an internal power grid 264 within the building 260. The power grid 264 may be an electrical network that provides power throughout the building, and may have one or more plugs 268A, 268B, 268C, 268D, which provide power to one or more electronic devices or appliances 270, such as a light emitting diode (LED) display monitor. The building 260 is associated with a user 272, who manages, owns, or controls operations of the building 260 and may use a user device 274 to communicate with other electronic devices. One or more voltage sensors 292 may be connected to the internal power grid 264 or the circuit breaker panel 262.

The user device 274 may communicate with the processing server 256 to obtain energy information regarding building 260 such as the power consumption, voltage changes, other data related to energy consumption patterns in building 260. The obtained energy information may be displayed to user 272 using any suitable graphical user interface.

The power utility meter 252 may be deployed by a utility company and may track the power consumption in building 260. The power utility meter 252 may be connected to the internal power grid 264 and the circuit breaker panel 262 through a wired connection 278, and, in general, is located outside building 260. The power utility meter 252 may provide data indicative of the power consumption to a power utility company server 254 using any suitable means. For example, in some cases, an employee of the utility company may periodically visit the building 260 and record the meter values, e.g., kilowatt hours (kWh), displayed by the power utility meter 252. In some cases, the power utility meter 252 may periodically transmit data indicative of the power consumption in building 260 to the power utility company server 254 using a wired or wireless network.

In some implementations, the power utility meter 252 may be a smart meter 252 that measures the current or power being consumed by internal power grid 264, and may provide an indication of the power consumption at certain time periods. Data regarding the power consumption of the internal power grid 264 may be wirelessly transmitted to the power utility company server 254. The power utility company server 254 may have a built-in transceiver system that is configured to communicate the power consumption data received from the smart meter 252 to the processing server 256.

The power utility company server 254 may include a database that stores consumption data for some or all of the utility company's customers. The consumption data may be fed manually by one or more operators or may be received from a smart meter 252, processed, and stored in a customer's profile in the database. The power utility company server 254 may provide the consumption data to one or more authorized parties, such as approved third parties or the utility company's billing department.

Building 260 could be any type of building including, for example, a single family home, a town home, a condominium, an apartment, an office building, and a residential building, A circuit breaker panel 262 may be attached inside the building 260. The circuit breaker panel 262 receives power from the external power grid through the external power network access point 250 and divides the power into different paths to supply the incoming power to a plurality of circuits throughout the building 260. The circuit breaker panel 262 may include various types of hardware such as circuit breakers, switches, and conductive wires. One or more switches in the circuit breaker panel 262 may be turned on or off based on the amount of current being provided to each supply path or circuit. In some cases, each switch may be configured to switch off in case of power overload to reduce the risk of property damage and fires.

In some implementations, one or more voltage sensors 292 may be connected to the internal power grid 264 through one or more plugs 268A 268B, 268C, 268D to sense the voltage supply to building 260. The one or more voltage sensors 292 may also be connected to an external monitoring system or network, such as home monitoring network, and may be configured to provide voltage measurement data to the external monitoring system or network. For example, the one or more voltage sensors 292 may have a sampling rate, e.g., 60 Hz, at which periodic voltage measurements are taken. Data indicative of the periodic voltage measurements may be transmitted to the external monitoring system or network through router 290.

The processing server 256 may be connected to one or more networks and may receive voltage data of the internal power grid 264 from the one or more voltage sensors 292. The processing server 256 may include or be connected to a database that includes one or more user accounts. The user accounts may store data indicative of one or more of voltage data and power consumption data for one or more users.

The processing server 256 may be configured to communicate with the power utility company server 254 and obtain power consumption data provided by a smart meter for one or more users. In particular, a user, such as user 272, may grant the processing server 256 authorization to access the user's account information from the power utility company server 254. Upon obtaining the authorization, the processing server 256 may periodically request the power utility company server 254 for user 272's power consumption data during a particular period of time. The power utility company server 254 may then retrieve and transmit the stored consumption data it obtained from the smart meter 252 for the requested period of time.

By obtaining electrical consumption data from two different sources namely, the smart meter 252 and the one or more voltage sensors 292, the processing server 256 may perform one or more operations to provide more accurate and detailed consumption data to user 272. For example, in some implementations, the processing server 256 may compare the power consumption data received from the smart meter 252 and the voltage data received from the one or more sensors 292. The data received from the smart meter 252 and the one or more voltage sensors 292 may be timestamped and event spaced to synchronize the two data sets. The processing server 256 may determine whether the voltage fluctuations are due to internal or external electrical equipment.

For example, the data received from the smart meter 252 may indicate that the power consumed by building 260 did not increase at time $t_2$. However, data received from the one or more voltage sensors 292 may indicate that a voltage supplied in the internal power grid 264 at time $t_2$ did fluctuate. This difference may indicate that the voltage change detected by the one or more voltage sensors 292 may be due to an external interference, such as the powering on or off of an electronic appliance outside building 260 but in proximity to building 260.

In another example, if the data received from the smart meter 252 and the one or more voltage sensors 292 indicates that a voltage supplied to building 260 changed at time $t_2$ and the power consumed by building 260 increased at time $t_2$, the processing server 256 may determine that a device on the internal power grid 264 was turned on or off approximately at time $t_2$, which caused the voltage change.

The processing server 256 may also conduct one or more of the following operations. For example, in some implementations, the processing server 256 may determine one or more attributes of the voltage changes such as a voltage change over time, phase change over time, voltage harmonic change over time, and phase harmonic change over time. These voltage attributes may be used to determine the types of devices connected to the internal power grid 264 and group events from the same appliances together.

In some implementations, group voltage attributes are analyzed, and group voltage attributes that are similar to known device class attributes are identified and extracted. For example, particular devices may have a particular phase and harmonic signals profile. Thus, group voltage attributes that exhibit similar phase and harmonic signal profiles may be classified as likely arising from a device from a known device class. Known device classes include various types of electronic devices such as a clothes dryer, a clothes washer, a dishwasher, a water heater, television, or heating, ventilation, and air conditioning (HVAC) unit. An "unknown device" label may be assigned to an event group that has voltage attributes that do not correspond to a known device class attribute.

In some implementations, the timing of events may be analyzed to determine a correlation or relationship between two or more events. If a timing relationship is determined, the event groups may be associated together. For example, voltage changes due to the use of a washer and dryer may be correlated since they often overlap. Using timing statistics, missing events may be inserted and additional events may be removed from associated event groups to form an event log for each device, including known and unknown devices. The event log may contain an event sequence based on allowable power states for each device, such as an off-to-on event followed by an on-to-off event, which is repeated. Certain complex devices may switch between low and high power state with high frequencies or may have other intermediate power states.

Power estimates for each classified device may be based on level of voltage changes relative to voltage changes from a calibration process using a known load. A voltage change detected by the voltage sensors 292 may be compared to the voltage change from the calibration process, and the difference may be used to determine power estimates.

For each classified device, the associated event log and power estimate may be used to determine energy consumption. The energy consumption for each classified device may be reported to the user 272, along with a cost estimate based on known utility rates. In addition, future energy costs for each device may be estimated based on usage patterns. This information can be communicated to the user from user device 274 or other computing devices using email, text messages, web pages or local application software.

In some implementations, an unknown device may be classified based on the voltage attributes, timing information, and additional information such as feature extraction. Feature extraction may include certain properties or features of a device such as, a device being a 240 volts alternating current (VAC), a device including a motor, a device including a power source such a battery or generator. The additional information may include various types of information, including but not limited to, data indicative of a weather or time-of-day.

The processing server 256 may obtain the additional information by communicating with additional servers through the Internet. The processing server 256 may correlate the timing of the use of washers, dryers, heating, and air conditioning with weather patterns or certain times of the day. For instance, processing server 256 may determine that washer and dryers are used on Sunday afternoons or that electrical heating and electronic device power consumption increases on days when a snowstorm is present at the building 260's location. By communicating with a weather database or server, the processing server 256 may estimate power consumption during future snowstorms.

In some implementations, a method of matching to the last detected event may be effective for determining whether an event is internal or external. For example, if two consecutive power measurements are the same, then any single intervening detected event is external. In another example, if two detected events occur between two consecutive power measurements and these events are not offsetting, e.g., off-to-on and on-to-off with same power level, then: a) none of the detected events are internal if the power measurements are the same; b) the detected event with the same delta power as the power measurement difference is internal and the other external; or c) both events are internal to the building 260 if the sum of the power deltas equals the same delta power as the power measurement difference.

The above-noted matching method may be applied as events are detected, thus reducing processing requirements in subsequent steps while improving accuracy. In some cases, additional logic may be applied to handle more complex sequences.

In some implementations, power measurements can also be used to determine whether groups of events and associated groups of events are due to an internal or external device. This determination may be made by identifying clean sequences of grouped events with power measurements. For example, from associated groups of events, a sequence may be found that has a power measurement, followed by an off-to-on event, followed by a power measurement with a difference from previous measurement of the same delta power as the event, followed by an on-to-off event, with no other events present. This is similar to the approach for processing incoming events noted above, except the internal versus external decision can be applied to all events in the associated groups.

The implementations described above relate to a smart meter 252 and voltage sensors 292 connected to the internal power grid 264 providing voltage or power consumption data to a processing server 256. In some implementations, one or more other devices may be utilized in conjunction with the smart meter 252 or in place of the smart meter 252 as described in more detail below.

Figure 3:
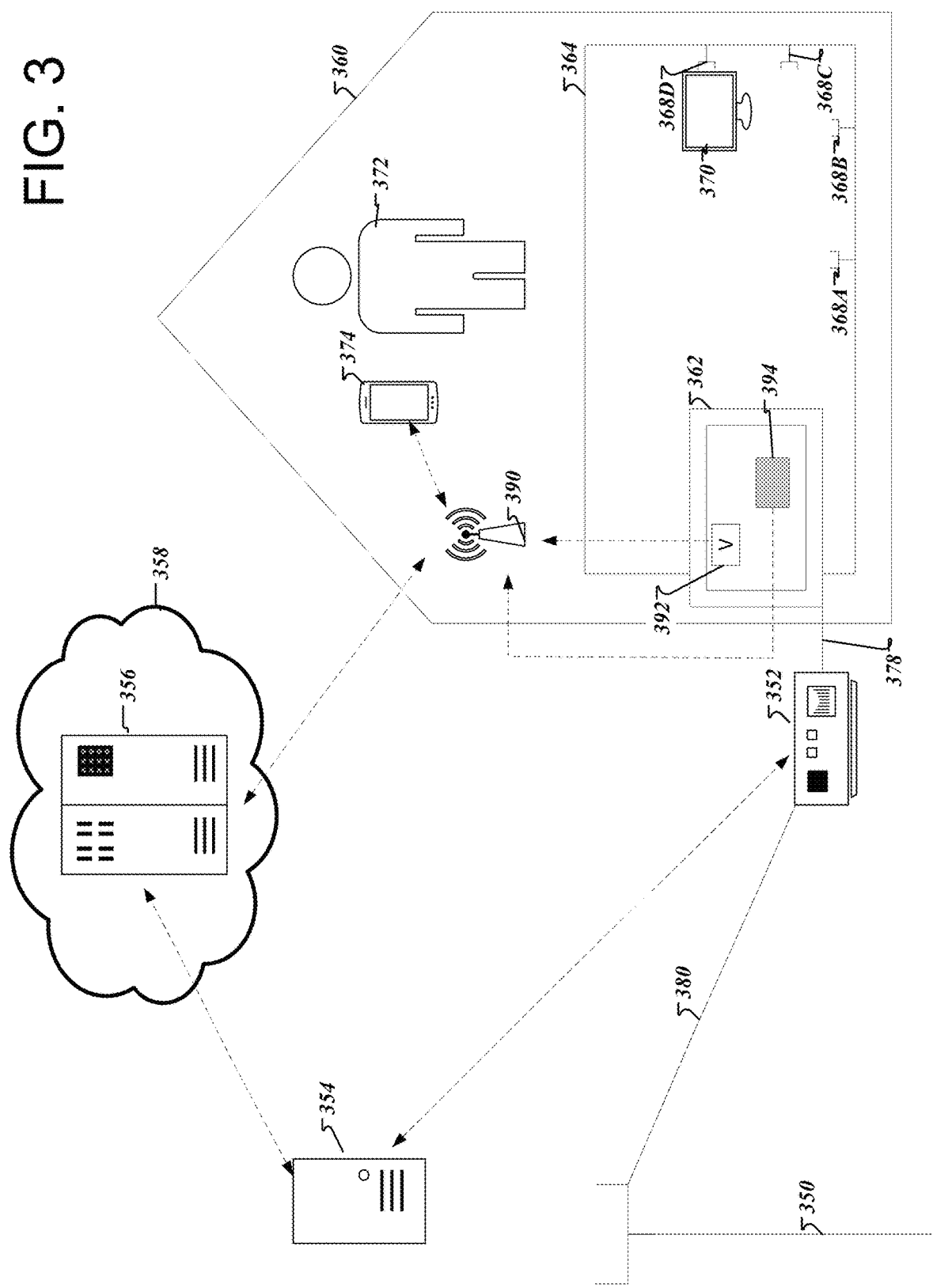
FIG. 3 depicts an example system for voltage tracking.

For example, as shown in FIG. 3, one or more Hall Effect sensors 394 may be utilized in place of a smart meter. The Hall Effect sensors 394 may be mounted on the circuit breaker panel 362 or connected to the internal power grid 364 to sense current being provided to the whole building 360. Current changes detected by the Hall Effect sensors 394 may be used to estimate whole building power changes, since voltage may remain relatively constant. For external events (changes occurring outside building 360), no current change is detected. For internal events (changes occurring inside building 360), current change is detected.

Current data of the internal power grid 364 that is detected by the Hall Effect sensors 394 may be wirelessly transmitted to the processing server 356. In some implementations, the current data of the internal power grid 364 may be transmitted through a router 390 in the building 360 that the Hall Effect sensors 394 are authorized to communicate with. The processing server 356 may use sensor timestamps and event spacing operations to synchronize the current and power data received from the Hall Effect sensors 394 and the voltage data received from one or more voltage sensors 392. The processing server 356 may then perform one or more of the above-described operations but use Hall Effect sensor data instead of smart meter power consumption data. In some implementations, the Hall Effect sensors 394 may connect directly to or communicate directly with one or more of the voltage sensors to combine and synchronize voltage and current measurements.

In the system depicted in FIG. 3, the external power network access point 350, power lines 380, power utility meter 352, wired connection 378, power utility company server 354, processing server 356, network 358, building 360, internal power grid 364, one or more plugs 368A, 368B, 368C, 368D, appliance 370, user 372, and user device 374 are the same as the external power network access point 250, power lines 280, power utility meter 252, wired connection 278, power utility company server 254, processing server 256, network 258, building 260, internal power grid 264, one or more plugs 268A, 268B, 268C, 268D, appliance 270, user 272, and user device 274 described with respect to FIG. 2.

In some implementations, current clamps may be used instead of Hall Effect sensors 394 to sense current being provided to the whole building 360. The current clamps may be connected to the internal power grid 364 and may operate in a similar manner as the Hall Effect sensors 394 described above. In some implementations, other devices such as visual, optical, and magnetic devices may be used in conjunction with or in place of the smart meter, Hall Effect sensors, or current clamps. These other devices may monitor power consumption by visually or magnetically interfacing with a power meter. For example, in some cases, a camera may be used to obtain images of a smart meter or a power meter. In some cases, an electromagnetic field (EMF) meter or an electricity meter may be used to measure the power consumption of building 360. Data from the camera, EMF meter, or electricity meter may be sent to the processing server 356.

Figure 3A:
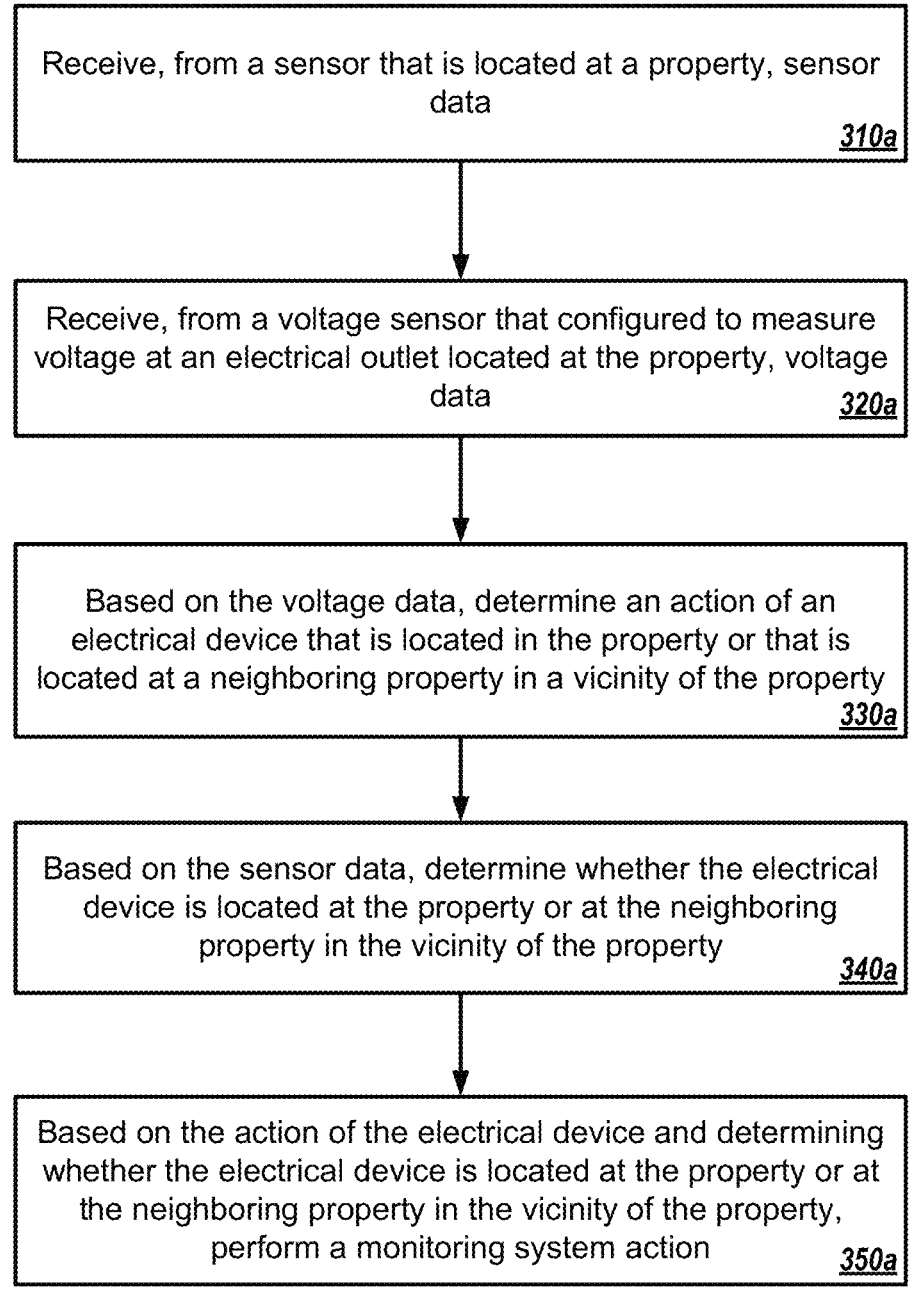
FIG. 3A is a flowchart of an example process for voltage event tracking and classification.

FIG. 3A is a flowchart of an example process 300a for voltage event tracking and classification. In general, the process 300a collects sensor data from a sensor located at a property and voltage data from a voltage sensor located at the property. The process 300a determines an action performed by an electrical device and determines whether the electrical device is located at the property or at a nearby property. The process 300a will be describes as being performed by a monitoring system comprising one or more computers, for example the systems illustrates in FIG. 1, 2, or 3. The monitoring system may also include sensors and voltage sensors.

The monitoring system receives, from a sensor that is located at a property, sensor data (310a). In some implementations the sensor is a magnetic field sensor that is located at a circuit breaker panel of the property and that is configured to generate sensor data that indicates whether power consumption of the property has changed. For example, the magnetic field sensor is a Hall effect sensor that is located at a main incoming electrical wire at the property. In some implementations, the sensor is configured to sense magnetic fields generated by flowing current, is located at a circuit breaker panel of the property, and is configured to generate sensor data that indicates a power consumption of the property. For example, the sensor is a current clamp that is connected to a main incoming electrical wire at the property.

In some implementations, the sensor is a camera that is located at an electrical meter that is configured to collect power usage data at the property and that is located at the property, and the sensor data is image data of a display of the electrical meter. For example, the sensor data may be a picture of the reading of the electrical meter. In some implementations, the sensor is video data of a spinning disc of the electrical meter. For example, the sensor data may be a video of the electrical meter that shows how fast or slow a disc of the electrical meter is spinning.

In some implementations, the sensor is integrated with the electrical meter. For example, the electrical meter may be a smart meter that is configured to collect power usage data at periodic intervals. The electrical meter may transmit the power usage data to a server for the monitoring system to download. The monitoring system may download the power usage data at periodic intervals such as hourly, daily, or weekly. The power usage data may be timestamped by the smart meter or by the monitoring system if the monitoring system accesses the power usage data in real time.

In some implementations, the sensor may be a motion sensor, a microphone, or a camera that is located near an electrical device at the property. The camera may generate image or video data of the electrical device and may show a person using the electrical device or the electrical device operating. The motion sensor data may indicate whether motion is present near the electrical device. Audio data form the microphone may indicate whether a person is near the electrical device or whether the electrical device is operating. The monitoring system may timestamp the motion data, camera data, or audio data.

The monitoring system receives, from a voltage sensor that configured to measure voltage at an electrical outlet located at the property, voltage data (320a). In some implementations, the voltage sensor may be plugged into any electrical outlet of the property. In some implementations, the voltage sensor may be located at the circuit breaker panel at the property. The voltage sensor may measure the voltage at the electrical outlet or at the circuit breaker panel.

The monitoring system, based on the voltage data, determines an action of an electrical device that is located in the property or that is located at a neighboring property in a vicinity of the property (330a). The monitoring system may compare the voltage data pattern to a series of voltage data patterns that are each matched with a different action of an electrical device. For example, a voltage data pattern may correspond to a washing machine washing cycle or a refrigerator compressor cycling on and off. In some implementations, the monitoring system may provide the voltage data as an input to a model that is trained using machine learning and different samples of voltage data patterns that are each labeled with a corresponding action of an electrical device. The model may output an action of an electrical device that most closely matches the voltage data.

The monitoring system, based on the sensor data, determines whether the electrical device is located at the property or at the neighboring property in the vicinity of the property (340a). In some implementations, the monitoring system compares the timestamps of the sensor data and the voltage data to determine whether the action of the electrical device occurred at the property or at a neighboring property. In some implementations, the monitoring system compares the sensor data and the voltage data to determine whether the energy consumption indicated by the voltage data occurred at the property or at a neighboring property. For example, the monitoring system may determine that a washing machine ran between 6 pm and 7 pm. The monitoring system may process the sensor data to determine whether the power consumption of the property changed during that time period. If the power consumption changed, then the running washing machine was likely at the property. If the power consumption did not change, then the running washing machine was likely at a neighboring property.

The monitoring system, based on the action of the electrical device and determines whether the electrical device is located at the property or at the neighboring property in the vicinity of the property, performing a monitoring system action (350a). In some implementations, the monitoring system action is logging the action of the electrical device if the electrical device is located at the property. For example, if the washing machine at the property ran between 6 pm and 7 pm, then the monitoring system stores data indicating that the washing machine ran between 6 pm and 7 pm. If the monitoring system determines that the washing machine at a neighboring property ran between 6 pm and 7 pm, then the monitoring system bypasses storing data indicating that the washing machine ran between 6 pm and 7 pm.

In some implementations, the monitoring system determines that an electrical device at the property performed the action. In this instance, the monitoring system may determine that the action should be reported to a resident of the property. This determination may be based on preferences set by the resident or the action of the electrical device. For example, if an iron has remained on for longer than thirty minutes, then the monitoring system may transmit a notification to the resident independent of the preferences of the resident. As another example, if the air conditioner has been running for three hours, then the monitoring system may transmit a notification to the resident that the air conditioner has been running for three hours if the resident previously set a corresponding preference. As another example, if the air conditioner has been running for two hours, then the monitoring system may not transmit a notification to the resident that the air conditioner has been running for two hours if the resident previously set a corresponding preference.

Figure 4:
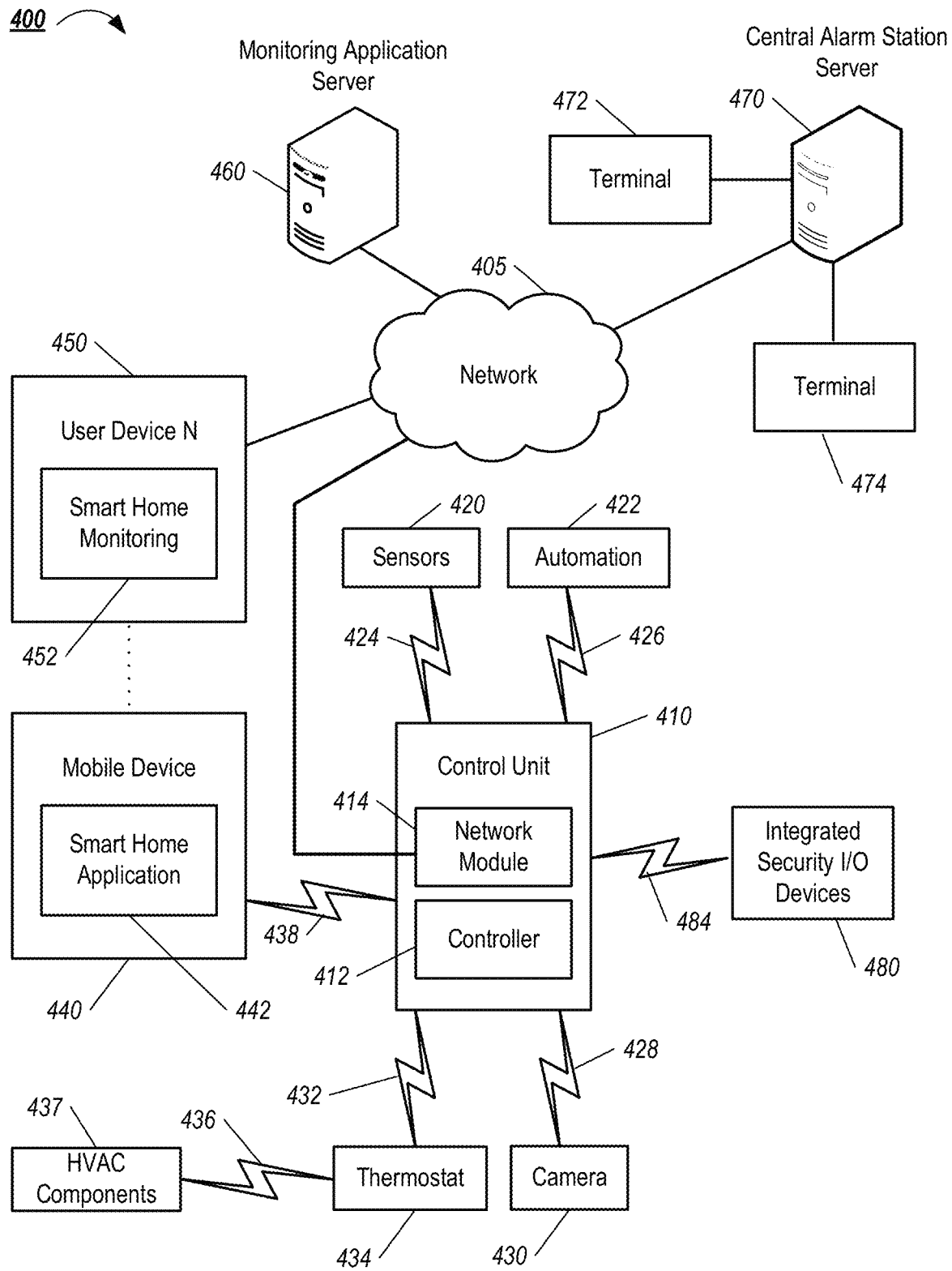
FIG. 4 is a block diagram of an example security monitoring system.

Embodiments and all of the functional operations and/or actions described in this specification may be implemented in the example security monitoring system 400 shown in FIG. 4. The electronic system 400 includes a network 405, a control unit 410, one or more user devices 440 and 450, a monitoring application server 460, and a central alarm station server 470. In some examples, the network 405 facilitates communications between the control unit 410, the one or more user devices 440 and 450, the monitoring application server 460, and the central alarm station server 470.

The network 405 is configured to enable exchange of electronic communications between devices connected to the network 405. For example, the network 405 may be configured to enable exchange of electronic communications, such as power consumption data, voltage supply data, or appliance fault detection, between the control unit 410, the one or more user devices 440 and 450, the monitoring application server 460, and the central alarm station server 470. The network 405 may include, for example, one or more of the Internet, Wide Area Networks (WANs), Local Area Networks (LANs), analog or digital wired and wireless telephone networks (e.g., a public switched telephone network (PSTN), Integrated Services Digital Network (ISDN), a cellular network, and Digital Subscriber Line (DSL)), radio, television, cable, satellite, or any other delivery or tunneling mechanism for carrying data. Network 405 may include multiple networks or subnetworks, each of which may include, for example, a wired or wireless data pathway. The network 405 may include a circuit-switched network, a packet-switched data network, or any other network able to carry electronic communications (e.g., data or voice communications). For example, the network 405 may include networks based on the Internet protocol (IP), asynchronous transfer mode (ATM), the PSTN, packet-switched networks based on IP, X.25, or Frame Relay, or other comparable technologies and may support voice using, for example, VoIP, or other comparable protocols used for voice communications. The network 405 may include one or more networks that include wireless data channels and wireless voice channels. The network 405 may be a wireless network, a broadband network, or a combination of networks including a wireless network and a broadband network.

The control unit 410 includes a controller 412 and a network module 414. The controller 412 is configured to control a control unit monitoring system (e.g., a control unit system) that includes the control unit 410. In some examples, the controller 412 may include a processor or other control circuitry configured to execute instructions of a program that controls operation of a control unit system. In these examples, the controller 412 may be configured to receive input from sensors, flow meters, or other devices included in the control unit system and control operations of devices included in the household (e.g., speakers, lights, doors, etc.). For example, the controller 412 may be configured to control operation of the network module 414 included in the control unit 410.

The network module 414 is a communication device configured to exchange communications over the network 405. The network module 414 may be a wireless communication module configured to exchange wireless communications over the network 405. For example, the network module 414 may be a wireless communication device configured to exchange communications over a wireless data channel and a wireless voice channel. In this example, the network module 414 may transmit alarm data over a wireless data channel and establish a two-way voice communication session over a wireless voice channel. The wireless communication device may include one or more of a LTE module, a GSM module, a radio modem, cellular transmission module, or any type of module configured to exchange communications in one of the following formats: LTE, GSM or GPRS, CDMA, EDGE or EGPRS, EV-DO or EVDO, UMTS, or IP.

The network module 414 also may be a wired communication module configured to exchange communications over the network 405 using a wired connection. For instance, the network module 414 may be a modem, a network interface card, or another type of network interface device. The network module 414 may be an Ethernet network card configured to enable the control unit 410 to communicate over a local area network and/or the Internet. The network module 414 also may be a voiceband modem configured to enable the alarm panel to communicate over the telephone lines of Plain Old Telephone Systems (POTS).

The control unit system that includes the control unit 410 includes one or more sensors. For example, the monitoring system may include multiple sensors 420. The sensors 420 may include a lock sensor, a contact sensor, a motion sensor, or any other type of sensor included in a control unit system. The sensors 420 also may include an environmental sensor, such as a temperature sensor, a water sensor, a rain sensor, a wind sensor, a light sensor, a smoke detector, a carbon monoxide detector, an air quality sensor, etc. The sensors 420 further may include a health monitoring sensor, such as a prescription bottle sensor that monitors taking of prescriptions, a blood pressure sensor, a blood sugar sensor, a bed mat configured to sense presence of liquid (e.g., bodily fluids) on the bed mat, etc. In some examples, the sensors 420 may include a radio-frequency identification (RFID) sensor that identifies a particular article that includes a pre-assigned RFID tag. In some cases, the sensors 420 may communicate directly or indirectly with one or more devices in network 405.

The control unit 410 communicates with the module 422 and the camera 430 to perform monitoring. The module 422 is connected to one or more devices that enable home automation control. For instance, the module 422 may be connected to one or more lighting systems and may be configured to control operation of the one or more lighting systems. Also, the module 422 may be connected to one or more electronic locks at the property and may be configured to control operation of the one or more electronic locks (e.g., control Z-Wave locks using wireless communications in the Z-Wave protocol. Further, the module 422 may be connected to one or more appliances at the property and may be configured to control operation of the one or more appliances. The module 422 may include multiple modules that are each specific to the type of device being controlled in an automated manner. The module 422 may control the one or more devices based on commands received from the control unit 410. For instance, the module 422 may cause a lighting system to illuminate an area to provide a better image of the area when captured by a camera 430.

The camera 430 may be a video/photographic camera or other type of optical sensing device configured to capture images. For instance, the camera 430 may be configured to capture images of a smart meter, a voltage sensor, or in general, any area within a building or within a residential facility 102-A monitored by the control unit 410. The camera 430 may be configured to capture single, static images of the area and also video images of the area in which multiple images of the area are captured at a relatively high frequency (e.g., thirty images per second). The camera 430 may be controlled based on commands received from the control unit 410.

The camera 430 may be triggered by several different types of techniques. For instance, a Passive Infra-Red (PIR) motion sensor may be built into the camera 430 and used to trigger the camera 430 to capture one or more images when motion is detected. The camera 430 also may include a microwave motion sensor built into the camera and used to trigger the camera 430 to capture one or more images when motion is detected. The camera 430 may have a "normally open" or "normally closed" digital input that can trigger capture of one or more images when external sensors (e.g., the sensors 420, PIR, door/window, etc.) detect motion or other events. In some implementations, the camera 430 receives a command to capture an image when external devices detect motion or another potential alarm event. The camera 430 may receive the command from the controller 412 or directly from one of the sensors 420.

In some examples, the camera 430 triggers integrated or external illuminators (e.g., Infra-Red, Z-wave controlled "white" lights, lights controlled by the module 422, etc.) to improve image quality when the scene is dark. An integrated or separate light sensor may be used to determine if illumination is desired and may result in increased image quality.

The camera 430 may be programmed with any combination of time/day schedules, system "arming state", or other variables to determine whether images should be captured or not when triggers occur. The camera 430 may enter a low-power mode when not capturing images. In this case, the camera 430 may wake periodically to check for inbound messages from the controller 412. The camera 430 may be powered by internal, replaceable batteries if located remotely from the control unit 410. The camera 430 may employ a small solar cell to recharge the battery when light is available. Alternatively, the camera 430 may be powered by the controller's 412 power supply if the camera 430 is co-located with the controller 412.

In some implementations, the camera 430 communicates directly with the monitoring application server 460 or a processing server over the Internet. In these implementations, image data captured by the camera 430 does not pass through the control unit 410 and the camera 430 receives commands related to operation from the monitoring application server 460.

The system 400 also includes thermostat 434 to perform dynamic environmental control at the property. The thermostat 434 is configured to monitor temperature and/or energy consumption of an HVAC system associated with the thermostat 434, and is further configured to provide control of environmental (e.g., temperature) settings. In some implementations, the thermostat 434 can additionally or alternatively receive data relating to activity at a property and/or environmental data at a property, e.g., at various locations indoors and outdoors at the property. The thermostat 434 can directly measure energy consumption of the HVAC system associated with the thermostat, or can estimate energy consumption of the HVAC system associated with the thermostat 434, for example, based on detected usage of one or more components of the HVAC system associated with the thermostat 434. The thermostat 434 can communicate temperature and/or energy monitoring information to or from the control unit 410 and can control the environmental (e.g., temperature) settings based on commands received from the control unit 410.

In some implementations, the thermostat 434 is a dynamically programmable thermostat and can be integrated with the control unit 410. For example, the dynamically programmable thermostat 434 can include the control unit 410, e.g., as an internal component to the dynamically programmable thermostat 434. In addition, the control unit 410 can be a gateway device that communicates with the dynamically programmable thermostat 434.

A module 437 is connected to one or more components of an HVAC system associated with a property, and is configured to control operation of the one or more components of the HVAC system. In some implementations, the module 437 may be connected to the internal power grid of the property and also configured to monitor energy consumption of the HVAC system components, for example, by directly measuring the energy consumption of the HVAC system components or by estimating the energy usage of the one or more HVAC system components based on detecting usage of components of the HVAC system. The module 437 can communicate energy monitoring information and the state of the HVAC system components to the thermostat 434 and can control the one or more components of the HVAC system based on commands received from the thermostat 434.

In some examples, the system 400 further includes one or more robotic devices. The robotic devices may be any type of robots that are capable of moving and taking actions that assist in security monitoring. For example, the robotic devices may include drones that are capable of moving throughout a property based on automated control technology and/or user input control provided by a user. In this example, the drones may be able to fly, roll, walk, or otherwise move about the property. The drones may include helicopter type devices (e.g., quad copters), rolling helicopter type devices (e.g., roller copter devices that can fly and also roll along the ground, walls, or ceiling) and land vehicle type devices (e.g., automated cars that drive around a property). In some cases, the robotic devices may be robotic devices that are intended for other purposes and merely associated with the system 400 for use in appropriate circumstances. For instance, a robotic vacuum cleaner device may be associated with the monitoring system 400 as one of the robotic devices and may be controlled to take action responsive to monitoring system events.

In some examples, the robotic devices automatically navigate within a property. In these examples, the robotic devices include sensors and control processors that guide movement of the robotic devices within the property. For instance, the robotic devices may navigate within the property using one or more cameras, one or more proximity sensors, one or more gyroscopes, one or more accelerometers, one or more magnetometers, a global positioning system (GPS) unit, an altimeter, one or more sonar or laser sensors, and/or any other types of sensors that aid in navigation about a space. The robotic devices may include control processors that process output from the various sensors and control the robotic devices to move along a path that reaches the desired destination and avoids obstacles. In this regard, the control processors detect walls or other obstacles in the property and guide movement of the robotic devices in a manner that avoids the walls and other obstacles.

In addition, the robotic devices may store data that describes attributes of the property. For instance, the robotic devices may store a floorplan and/or a three-dimensional model of the property that enables the robotic devices to navigate the property. During initial configuration, the robotic devices may receive the data describing attributes of the property, determine a frame of reference to the data (e.g., a home or reference location in the property), and navigate the property based on the frame of reference and the data describing attributes of the property. Further, initial configuration of the robotic devices also may include learning of one or more navigation patterns in which a user provides input to control the robotic devices to perform a specific navigation action (e.g., fly to an upstairs bedroom and spin around while capturing video and then return to a home charging base). In this regard, the robotic devices may learn and store the navigation patterns such that the robotic devices may automatically repeat the specific navigation actions upon a later request.

In some examples, the robotic devices may include data capture and recording devices. In these examples, the robotic devices may include one or more cameras, one or more motion sensors, one or more microphones, one or more biometric data collection tools, one or more temperature sensors, one or more humidity sensors, one or more air flow sensors, and/or any other types of sensors that may be useful in capturing monitoring data related to the property and users in the property. The one or more biometric data collection tools may be configured to collect biometric samples of a person in the home with or without contact of the person. For instance, the biometric data collection tools may include a fingerprint scanner, a hair sample collection tool, a skin cell collection tool, and/or any other tool that allows the robotic devices to take and store a biometric sample that can be used to identify the person (e.g., a biometric sample with DNA that can be used for DNA testing).

In some implementations, the robotic devices may include output devices. In these implementations, the robotic devices may include one or more displays, one or more speakers, and/or any type of output devices that allow the robotic devices to communicate information to a nearby user.

The robotic devices also may include a communication module that enables the robotic devices to communicate with the control unit 410, each other, and/or other devices. The communication module may be a wireless communication module that allows the robotic devices to communicate wirelessly. For instance, the communication module may be a Wi-Fi module that enables the robotic devices to communicate over a local wireless network at the property. The communication module further may be a 900 MHz wireless communication module that enables the robotic devices to communicate directly with the control unit 410. Other types of short-range wireless communication protocols, such as Bluetooth, Bluetooth LE, Zwave, Zigbee, etc., may be used to allow the robotic devices to communicate with other devices in the property.

The robotic devices further may include processor and storage capabilities. The robotic devices may include any suitable processing devices that enable the robotic devices to operate applications and perform the actions described throughout this disclosure. In addition, the robotic devices may include solid state electronic storage that enables the robotic devices to store applications, configuration data, collected sensor data, and/or any other type of information available to the robotic devices.

The robotic devices are associated with one or more charging stations. The charging stations may be located at predefined home base or reference locations in the property. The robotic devices may be configured to navigate to the charging stations after completion of tasks needed to be performed for the monitoring system 400. For instance, after completion of a monitoring operation or upon instruction by the control unit 410, the robotic devices may be configured to automatically fly to and land on one of the charging stations. In this regard, the robotic devices may automatically maintain a fully charged battery in a state in which the robotic devices are ready for use by the monitoring system 400.

The charging stations may be contact based charging stations and/or wireless charging stations. For contact based charging stations, the robotic devices may have readily accessible points of contact that the robotic devices are capable of positioning and mating with a corresponding contact on the charging station. For instance, a helicopter type robotic device may have an electronic contact on a portion of its landing gear that rests on and mates with an electronic pad of a charging station when the helicopter type robotic device lands on the charging station. The electronic contact on the robotic device may include a cover that opens to expose the electronic contact when the robotic device is charging and closes to cover and insulate the electronic contact when the robotic device is in operation.

For wireless charging stations, the robotic devices may charge through a wireless exchange of power. In these cases, the robotic devices need only locate themselves closely enough to the wireless charging stations for the wireless exchange of power to occur. In this regard, the positioning needed to land at a predefined home base or reference location in the property may be less precise than with a contact based charging station. Based on the robotic devices landing at a wireless charging station, the wireless charging station outputs a wireless signal that the robotic devices receive and convert to a power signal that charges a battery maintained on the robotic devices.

In some implementations, each of the robotic devices has a corresponding and assigned charging station such that the number of robotic devices equals the number of charging stations. In these implementations, the robotic devices always navigate to the specific charging station assigned to that robotic device. For instance, a first robotic device may always use a first charging station and a second robotic device may always use a second charging station.

In some examples, the robotic devices may share charging stations. For instance, the robotic devices may use one or more community charging stations that are capable of charging multiple robotic devices. The community charging station may be configured to charge multiple robotic devices in parallel. The community charging station may be configured to charge multiple robotic devices in serial such that the multiple robotic devices take turns charging and, when fully charged, return to a predefined home base or reference location in the property that is not associated with a charger. The number of community charging stations may be less than the number of robotic devices.

Also, the charging stations may not be assigned to specific robotic devices and may be capable of charging any of the robotic devices. In this regard, the robotic devices may use any suitable, unoccupied charging station when not in use. For instance, when one of the robotic devices has completed an operation or is in need of battery charge, the control unit 410 references a stored table of the occupancy status of each charging station and instructs the robotic device to navigate to the nearest charging station that is unoccupied.

The system 400 further includes one or more integrated security devices 480. The one or more integrated security devices may include any type of device used to provide alerts based on received sensor data. For instance, the one or more control units 410 may provide one or more alerts to the one or more integrated security input/output devices. Additionally, the one or more control units 410 may receive one or more sensor data from the sensors 420 and determine whether to provide an alert to the one or more integrated security input/output devices 480.

The sensors 420, the module 422, the camera 430, the thermostat 434, and the integrated security devices 480 communicate with the controller 412 over communication links 424, 426, 428, 432, 484, and 586. The communication links 424, 426, 428, 432, 484, and 586 may be a wired or wireless data pathway configured to transmit signals from the sensors 420, the module 422, the camera 430, the thermostat 434, and the integrated security devices 480 to the controller 412. The sensors 420, the module 422, the camera 430, the thermostat 434, and the integrated security devices 480 may continuously transmit sensed values to the controller 412, periodically transmit sensed values to the controller 412, or transmit sensed values to the controller 412 in response to a change in a sensed value. For example, in some cases, the sensors 420 may include voltage sensors and may transmit sensed voltage data to the controller 412.

The communication links 424, 426, 428, 432, 484, and 586 may include a local network. The sensors 420, the module 422, the camera 430, the thermostat 434, and the integrated security devices 480, and the controller 412 may exchange data and commands over the local network. The local network may include 802.11 "Wi-Fi" wireless Ethernet (e.g., using low-power Wi-Fi chipsets), Z-Wave, Zigbee, Bluetooth, "Homeplug" or other "Powerline" networks that operate over AC wiring, and a Category 5 (CAT5) or Category 5 (CAT6) wired Ethernet network. The local network may be a mesh network constructed based on the devices connected to the mesh network.

The monitoring application server 460 or processing server is an electronic device configured to provide monitoring services by exchanging electronic communications with the control unit 410, the one or more user devices 440 and 450, and the central alarm station server 470 over the network 405. For example, the monitoring application server 460 may be configured to monitor events (e.g., alarm events) generated by the control unit 610. In this example, the monitoring application server 660 may exchange electronic communications with the network module 414 included in the control unit 410 to receive information regarding events (e.g., alerts) detected by the control unit server 104a. The monitoring application server 460 also may receive information regarding events (e.g., alerts) from the one or more user devices 440 and 450.

In some examples, the monitoring application server 460 may route alert data received from the network module 414 or the one or more user devices 440 and 450 to the central alarm station server 470. For example, the monitoring application server 460 may transmit the alert data to the central alarm station server 470 over the network 405.

The monitoring application server 460 may store sensor and image data received from the monitoring system and perform analysis of sensor and image data received from the monitoring system. Based on the analysis, the monitoring application server 460 may communicate with and control aspects of the control unit 410 or the one or more user devices 440 and 450. For example, the monitoring application server 460 may receive voltage data from a voltage sensor or power consumption data from a smart meter and may process the received data, as described in the implementations noted above.

The central alarm station server 470 is an electronic device configured to provide alarm monitoring service by exchanging communications with the control unit 410, the one or more mobile devices 440 and 450, and the monitoring application server 460 over the network 405. For example, the central alarm station server 470 may be configured to monitor alerting events generated by the control unit 410. In this example, the central alarm station server 470 may exchange communications with the network module 414 included in the control unit 410 to receive information regarding alerting events detected by the control unit 410. The central alarm station server 470 also may receive information regarding alerting events from the one or more mobile devices 440 and 450 and/or the monitoring application server 460.

The central alarm station server 470 is connected to multiple terminals 472 and 474. The terminals 472 and 474 may be used by operators to process alerting events. For example, the central alarm station server 470 may route alerting data to the terminals 472 and 474 to enable an operator to process the alerting data. The terminals 472 and 474 may include general-purpose computers (e.g., desktop personal computers, workstations, or laptop computers) that are configured to receive alerting data from a server in the central alarm station server 470 and render a display of information based on the alerting data. For instance, the controller 412 may control the network module 414 to transmit, to the central alarm station server 470, alerting data indicating that a sensor 420 detected motion from a motion sensor via the sensors 420. The central alarm station server 470 may receive the alerting data and route the alerting data to the terminal 472 for processing by an operator associated with the terminal 472. The terminal 472 may render a display to the operator that includes information associated with the alerting event (e.g., the lock sensor data, the motion sensor data, the contact sensor data, etc.) and the operator may handle the alerting event based on the displayed information.

In some implementations, the terminals 472 and 474 may be mobile devices or devices designed for a specific function. The one or more user devices 440 and 450 are devices that host and display user interfaces. For instance, the user device 440 is a mobile device that hosts one or more native applications (e.g., the smart home application 442). The user device 440 may be a cellular phone or a non-cellular locally networked device with a display. The user device 440 may include a cell phone, a smart phone, a tablet PC, a personal digital assistant ("PDA"), or any other portable device configured to communicate over a network and display information. For example, implementations may also include Blackberry-type devices (e.g., as provided by Research in Motion), electronic organizers, iPhone-type devices (e.g., as provided by Apple), iPod devices (e.g., as provided by Apple) or other portable music players, other communication devices, and handheld or portable electronic devices for gaming, communications, and/or data organization. The user device 440 may perform functions unrelated to the monitoring system, such as placing personal telephone calls, playing music, playing video, displaying pictures, browsing the Internet, maintaining an electronic calendar, etc.

The user device 440 includes a smart home application 442. The smart home application 442 refers to a software/firmware program running on the corresponding mobile device that enables the user interface and features described throughout. The user device 440 may load or install the smart home application 442 based on data received over a network or data received from local media. The smart home application 442 runs on mobile devices platforms, such as iPhone, iPod touch, Blackberry, Google Android, Windows Mobile, etc. The smart home application 442 enables the user device 440 to receive and process image and sensor data from the monitoring system. The smart home application 442 may allow a user to view power consumption data or voltage change data in a building owned or managed by the user.

The user device 450 may be a general-purpose computer (e.g., a desktop personal computer, a workstation, or a laptop computer) that is configured to communicate with the monitoring application server 460 and/or the control unit 410 over the network 405. The user device 450 may be configured to display a smart home user interface 452 that is generated by the user device 450 or generated by the monitoring application server 460. For example, the user device 450 may be configured to display a user interface (e.g., a web page) provided by the monitoring application server 460 that enables a user to perceive images captured by the camera 430 and/or reports related to the monitoring system.

In some implementations, the one or more user devices 440 and 450 communicate with and receive monitoring system data from the control unit 410 using the communication link 438. For instance, the one or more user devices 440 and 450 may communicate with the control unit 410 using various local wireless protocols such as Wi-Fi, Bluetooth, Zwave, Zigbee, HomePlug (ethernet over powerline), or wired protocols such as Ethernet and USB, to connect the one or more user devices 440 and 450 to local security and automation equipment. The one or more user devices 440 and 450 may connect locally to the monitoring system and its sensors and other devices. The local connection may improve the speed of status and control communications because communicating through the network 405 with a remote server (e.g., the monitoring application server 460) may be significantly slower.

Although the one or more user devices 440 and 450 are shown as communicating with the control unit 410, the one or more user devices 440 and 450 may communicate directly with the sensors and other devices controlled by the control unit 410. In some implementations, the one or more user devices 440 and 450 replace the control unit 410 and perform the functions of the control unit 410 for local monitoring and long range/offsite communication.

In other implementations, the one or more user devices 440 and 450 receive monitoring system data captured by the control unit 410 through the network 405. The one or more user devices 440, 450 may receive the data from the control unit 410 through the network 405 or the monitoring application server 460 may relay data received from the control unit 410 to the one or more user devices 440 and 450 through the network 405. In this regard, the monitoring application server 460 may facilitate communication between the one or more user devices 440 and 450 and the monitoring system.

In some implementations, the one or more user devices 440 and 450 may be configured to switch whether the one or more user devices 440 and 450 communicate with the control unit 410 directly (e.g., through link 438) or through the monitoring application server 460 (e.g., through network 405) based on a location of the one or more user devices 440 and 450. For instance, when the one or more user devices 440 and 450 are located close to the control unit 410 and in range to communicate directly with the control unit 410, the one or more user devices 440 and 450 use direct communication. When the one or more user devices 440 and 450 are located far from the control unit 410 and not in range to communicate directly with the control unit 410, the one or more user devices 440 and 450 use communication through the monitoring application server 460.

Although the one or more user devices 440 and 450 are shown as being connected to the network 405, in some implementations, the one or more user devices 440 and 450 are not connected to the network 405. In these implementations, the one or more user devices 440 and 450 communicate directly with one or more of the monitoring system components and no network (e.g., Internet) connection or reliance on remote servers is needed.

In some implementations, the one or more user devices 440 and 450 are used in conjunction with only local sensors and/or local devices in a house. In these implementations, the system 400 only includes the one or more user devices 440 and 450, the sensors 420, the module 422, the camera 430, and the robotic devices. The one or more user devices 440 and 450 receive data directly from the sensors 420, the module 422, the camera 430, and the robotic devices and sends data directly to the sensors 420, the module 422, the camera 430, and the robotic devices. The one or more user devices 440, 450 provide the appropriate interfaces/processing to provide visual surveillance and reporting.

In other implementations, the system 400 further includes network 405 and the sensors 420, the module 422, the camera 430, the thermostat 434, and the robotic devices are configured to communicate sensor and image data to the one or more user devices 440 and 450 over network 405 (e.g., the Internet, cellular network, etc.). In yet another implementation, the sensors 420, the module 422, the camera 430, the thermostat 434, and the robotic devices (or a component, such as a bridge/router) are intelligent enough to change the communication pathway from a direct local pathway when the one or more user devices 440 and 450 are in close physical proximity to the sensors 420, the module 422, the camera 430, the thermostat 434, and the robotic devices to a pathway over network 405 when the one or more user devices 440 and 450 are farther from the sensors 420, the module 422, the camera 430, the thermostat 434, and the robotic devices. In some examples, the system leverages GPS information from the one or more user devices 440 and 450 to determine whether the one or more user devices 440 and 450 are close enough to the sensors 420, the module 422, the camera 430, the thermostat 434, and the robotic devices to use the direct local pathway or whether the one or more user devices 440 and 450 are far enough from the sensors 420, the module 422, the camera 430, the thermostat 434, and the robotic devices that the pathway over network 405 is required. In other examples, the system leverages status communications (e.g., pinging) between the one or more user devices 440 and 450 and the sensors 420, the module 422, the camera 430, the thermostat 434, and the robotic devices to determine whether communication using the direct local pathway is possible. If communication using the direct local pathway is possible, the one or more user devices 440 and 450 communicate with the sensors 420, the module 422, the camera 430, the thermostat 434, and the robotic devices using the direct local pathway. If communication using the direct local pathway is not possible, the one or more user devices 440 and 450 communicate with the sensors 420, the module 422, the camera 430, the thermostat 434, and the robotic devices using the pathway over network 405.

In some implementations, the system 400 provides end users with access to images captured by the camera 430 to aid in decision making. The system 400 may transmit the images captured by the camera 430 over a wireless WAN network to the user devices 440 and 450. Because transmission over a wireless WAN network may be relatively expensive, the system 400 uses several techniques to reduce costs while providing access to significant levels of useful visual information.

In some implementations, a state of the monitoring system and other events sensed by the monitoring system may be used to enable/disable video/image recording devices (e.g., the camera 430). In these implementations, the camera 430 may be set to capture images on a periodic basis when the alarm system is armed in an "Away" state, but set not to capture images when the alarm system is armed in a "Stay" state or disarmed. In addition, the camera 430 may be triggered to begin capturing images when the alarm system detects an event, such as an alarm event, a door-opening event for a door that leads to an area within a field of view of the camera 430, or motion in the area within the field of view of the camera 430. In other implementations, the camera 430 may capture images continuously, but the captured images may be stored or transmitted over a network when needed.

The described systems, methods, and techniques may be implemented in digital electronic circuitry, computer hardware, firmware, software, or in combinations of these elements. Apparatus implementing these techniques may include appropriate input and output devices, a computer processor, and a computer program product tangibly embodied in a machine-readable storage device for execution by a programmable processor. A process implementing these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially designed ASICs (application-specific integrated circuits).

While this specification contains many specifics, these should not be construed as limitations on the scope of the disclosure or of what may be claimed, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination. Moreover, although features may be described above as acting in certain combinations and may even be claimed as such, one or more features from a claimed combination may in some cases be excised from the combination, and the claimed combination may be directed to a sub-combination or variation of a sub-combination.

Similarly, the separation of various system components in the embodiments described above should not be understood as requiring such separation in all embodiments, and it should be understood that the described program components and systems may generally be integrated together in a single software product or packaged into multiple software products. For example, although some operations are described as being performed by a processing server, one of more of the operations may be performed by the smart meter or other network components.

It should be understood that the phrase one or more of and the phrase at least one of include any combination of elements. For example, the phrase one or more of A and B includes A, B, or both A and B. Similarly, the phrase at least one of A and B includes A, B, or both A and B.

Thus, particular implementations have been described. Other implementations are within the scope of the following claims. For example, the actions recited in the claims may be performed in a different order and still achieve desirable results.

What is claimed is:

1. A monitoring system that is configured to monitor a property, the monitoring system comprising:
   a sensor that is located at the property and that is configured to generate sensor data;
   a voltage sensor that is configured to generate voltage data by measuring voltage at an electrical outlet located at the property; and
   a monitor control unit that is configured to:
      receive, from the sensor, the sensor data;
      receive, from the voltage sensor, the voltage data;
      based on the voltage data, determine an action of an electrical device that is located in the property or that is located at a neighboring property in a vicinity of the property;
      based on the sensor data, determine whether the electrical device is located at the property or at the neighboring property in the vicinity of the property; and
      based on the action of the electrical device and determining whether the electrical device is located at the property or at the neighboring property in the vicinity of the property, perform a monitoring system action.

2. The monitoring system of claim 1, wherein the sensor is a magnetic field sensor that is located at a circuit breaker panel of the property and that is configured to generate sensor data that indicates whether power consumption of the property has changed.

3. The monitoring system of claim 2, wherein the magnetic field sensor is a Hall effect sensor.

4. The monitoring system of claim 1, wherein the sensor is configured to sense magnetic fields generated by flowing current, is located at a circuit breaker panel of the property, and is configured to generate sensor data that indicates a power consumption of the property.

5. The monitoring system of claim 4, wherein the sensor is a current clamp.

6. The monitoring system of claim 1, wherein:
   the sensor is a camera that is located at an electrical meter that is configured to collect power usage data at the property and that is located at the property, and
   the sensor data is image data of a display of the electrical meter.

7. The monitoring system of claim 1, wherein:
   the sensor is a camera that is located at an electrical meter that is configured to collect power usage data at the property and that is located at the property, and
   the sensor data is video data of a spinning disc of the electrical meter.

8. The monitoring system of claim 1, wherein:
   the sensor is integrated with an electrical meter that is configured to collect power usage data at the property and that is located at the property, and
   the sensor data is timestamped power usage data for the property.

9. The monitoring system of claim 1, wherein the monitor control unit is configured to:
   determine whether the electrical device is located at the property or at the neighboring property in the vicinity of the property by determining that the electrical device is located at the property; and
   perform the monitoring system action by logging the action of the electrical device that is located at the property.

10. The monitoring system of claim 1, wherein the monitor control unit is configured to:
    determine whether the electrical device is located at the property or at the neighboring property in the vicinity of the property by determining that the electrical device is located at the property;
    based on the action of the electrical device that is located at the property, generate a notification indicating the action of the electrical device that is located at the property; and
    perform the monitoring system action by transmitting, to a resident of the property, the notification indicating the action of the electrical device that is located at the property.

11. The monitoring system of claim 1, wherein the monitor control unit is configured to:
    determine whether the electrical device is located at the property or at the neighboring property in the vicinity of the property by determining that the electrical device is located at the neighboring property in the vicinity of the property; and
    perform the monitoring system action by bypassing logging of the action of the electrical device that is located at the neighboring property in the vicinity of the property.

12. The monitoring system of claim 1, wherein the monitor control unit is configured to:
    timestamp the sensor data;
    timestamp the voltage data; and
    determine whether the electrical device is located at the property or at the neighboring property in the vicinity of the property by comparing timestamps of the sensor data to timestamps of the voltage data.

13. The monitoring system of claim 12, wherein the monitor control unit is configured to:
    compare the timestamps of the sensor data to the timestamps of the voltage data by matching the timestamps of the sensor data with the timestamps of the voltage data; and
    based on matching the timestamps of the sensor data with the timestamps of the voltage, determine energy consumption of the electrical device and other electrical devices located at the property.

14. A computer-implemented method comprising:
    receiving, from a sensor that is located at a property, sensor data;
    receiving, from a voltage sensor that configured to measure voltage at an electrical outlet located at the property, voltage data;
    based on the voltage data, determining an action of an electrical device that is located in the property or that is located at a neighboring property in a vicinity of the property;

based on the sensor data, determining whether the electrical device is located at the property or at the neighboring property in the vicinity of the property; and based on the action of the electrical device and determining whether the electrical device is located at the property or at the neighboring property in the vicinity of the property, performing a monitoring system action.

15. The method of claim 14, wherein the sensor is a magnetic field sensor that is located at a circuit breaker panel of the property and that is configured to generate sensor data that indicates whether power consumption of the property has changed.

16. The method of claim 14, wherein the sensor is configured to sense magnetic fields generated by flowing current, is located at a circuit breaker panel of the property, and is configured to generate sensor data that indicates a power consumption of the property.

17. The method of claim 14, wherein:
the sensor is a camera that is located at an electrical meter that is configured to collect power usage data at the property and that is located at the property, and the sensor data is image data of a display of the electrical meter.

18. The method of claim 14, wherein:
determining whether the electrical device is located at the property or at the neighboring property in the vicinity of the property comprises determining that the electrical device is located at the property, and performing the monitoring system action comprises logging the action of the electrical device that is located at the property.

19. The method of claim 14, comprising:
determining whether the electrical device is located at the property or at the neighboring property in the vicinity of the property by determining that the electrical device is located at the property;

based on the action of the electrical device that is located at the property, generating a notification indicating the action of the electrical device that is located at the property; and performing the monitoring system action by transmitting, to a resident of the property, the notification indicating the action of the electrical device that is located at the property.

20. The method of claim 14, wherein:
determining whether the electrical device is located at the property or at the neighboring property in the vicinity of the property comprises determining that the electrical device is located at the neighboring property in the vicinity of the property, and performing the monitoring system action comprises bypassing logging of the action of the electrical device that is located at the neighboring property in the vicinity of the property.

* * * * *